United States Patent [19]

Takahashi

[11] Patent Number: 5,066,908
[45] Date of Patent: Nov. 19, 1991

[54] METHOD FOR ELECTRICALLY DETECTING POSITIONAL DEVIATION OF CONTACT HOLE IN SEMICONDUCTOR DEVICE

[75] Inventor: Yasushi Takahashi, Tokyo, Japan
[73] Assignee: NEC Corporation, Tokyo, Japan
[21] Appl. No.: 485,719
[22] Filed: Feb. 27, 1990
[30] Foreign Application Priority Data
   Feb. 27, 1989 [JP] Japan .................................. 1-47781
[51] Int. Cl.⁵ .......................................... G01R 31/00
[52] U.S. Cl. ............................... 324/158 R; 324/73.1;
                                                                       324/537
[58] Field of Search ................... 324/73.1, 158 R, 537,
       324/538, 500; 174/266, 250; 361/414, 410;
                                                                       437/8

[56] References Cited

U.S. PATENT DOCUMENTS

| | | | |
|---|---|---|---|
| 3,301,939 | 1/1967 | Krasnow | 174/266 |
| 3,859,711 | 1/1975 | McKiddy | 324/537 |
| 4,510,446 | 4/1985 | Braun et al. | 324/537 |
| 4,894,606 | 1/1990 | Paur | 324/73.1 |

Primary Examiner—Kenneth A. Wieder
Assistant Examiner—Vinh P. Nguyen
Attorney, Agent, or Firm—Sughrue, Mion, Zinn, Macpeak & Seas

[57] ABSTRACT

A method for detecting a positional deviation of a contact hole formed in an interlayer insulator layer includes the steps of forming a detection conductor pattern on a substrate at a peripheral portion of a contact hole formation area in which a contact hole is to be formed, and forming a first insulating layer to cover the detection conductor pattern. Then, a first conducting layer of a predetermined pattern is formed on the first insulating layer to cover the contact hole formation area, and a second insulating layer is formed to cover the first conducting layer. Furthermore, a contact hole is formed at the contact hole formation area in the second insulating layer, and a second conducting layer is deposited on the second insulation layer so that the second conducting layer is deposited within the contact hole. Thereafter, a short-circuit between the detection conductor pattern and one of the first and second conducting layers is detected. When the short-circuit is detected, it is judged that the formed contact hole adversely deviates from a proper position where the contact hole is to be formed.

8 Claims, 3 Drawing Sheets

METHOD FOR ELECTRICALLY DETECTING POSITIONAL DEVIATION OF CONTACT HOLE IN SEMICONDUCTOR DEVICE

BACKGROUND OF THE INVENTION

1. Field of the Invention

The present invention relates to an examination method for a semiconductor device manufacturing process, and more specifically to a method for detecting a positional deviation of a contact hole which is formed in an interlayer insulator layer to mutually connect a pair of conducting layers separated from each other by the interlayer insulator layer.

2. Description of Related Art

Conventionally, in the process for manufacturing semiconductor devices, a deviation of a contact hole formed in an interlayer insulator layer for mutually connecting a pair of conducting layers formed under and above the interlayer insulator, respectively, has been inspected by observing a so called "vernier calipers pattern" formed on a semiconductor device by use of an optical microscope. However, a visual inspection by a human being with an optical microscope is very low in efficiency.

Summary of the Invention

Accordingly, it is an object of the present invention to provide a method for detecting a deviation of a formed contact hole, which method has overcome the above mentioned defect of the conventional one.

Another object of the present invention is to provide a method for detecting a deviation of a formed contact hole, without a visual inspection using an optical microscope.

A still further object of the present invention is to provide a method for detecting a deviation of a formed contact hole, by an electrical property measurement which can be performed in an automatic manner.

The above and other objects of the present invention are achieved in accordance with the present invention by a method for detecting a positional deviation of a contact hole which is formed in an interlayer insulator layer to mutually connect a pair of conducting layers separated from each other by the interlayer insulator layer, comprising the steps of forming a detection conductor pattern on a substrate at a peripheral portion of a contact hole formation area in which a contact hole is to be formed, forming a first insulating layer to cover the detection conductor pattern, forming a first conducting layer of a predetermined pattern on the first insulating layer so as to cover the contact hole formation area, forming a second insulating layer to cover the first conducting layer, forming a contact hole in the second insulating layer at the contact hole formation area, forming a second conducting layer on the second insulation layer so that the second conducting layer is deposited within the contact hole, and detecting a short-circuit between the detection conductor pattern and one of the first and second conducting layers.

When the contact hole is formed in the second insulation layer, if the formed contact hole has deviated from a predetermined proper position, the formed contact hole would partially or entirely offset from a peripheral edge of the first or lower conducting layer, and therefore, a hole would be formed in the first insulating layer to reach the detection conductor pattern on one hand and to communicate with the contact hole formed in the second insulating layer on the other hand. Therefore, the second conducting layer formed on the second insulating layer will be deposited not only within the contact hole formed in the second insulating layer so as to contact the first conducting layer but also within the hole formed in the first insulating layer so as to contact the detection conductor pattern. As a result, the detection conductor pattern is brought into an electric contact with the first conducting layer and the second conducting layer. Accordingly, an adverse positional deviation of the formed contact hole can be known by detecting a short-circuit between the detection conductor pattern and the first conducting layer or between the detection conductor pattern and the second conducting layer.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
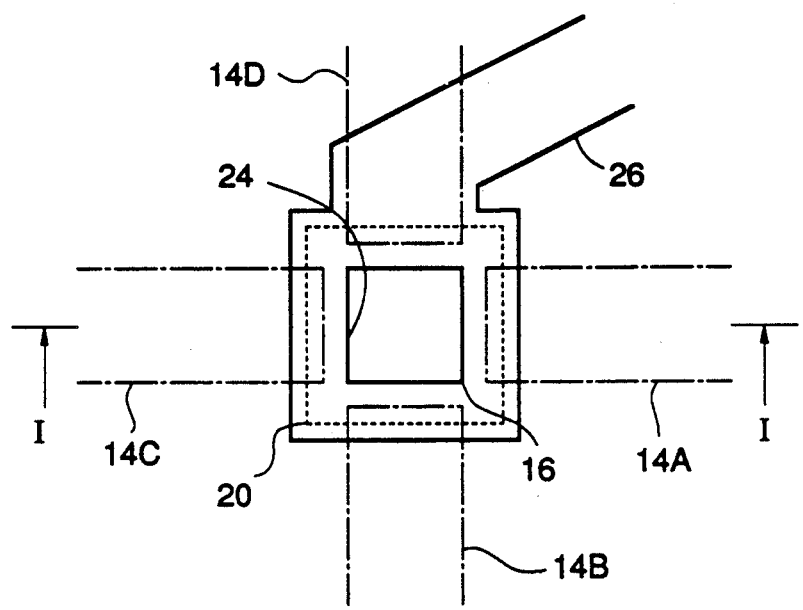
FIG. 1A is a diagrammatic plan view of a semiconductor device formed with one embodiment of a contact hole deviation checking conductor pattern in accordance with the present invention, in the case of no adverse deviation of the contact hole.
Figure 1B:
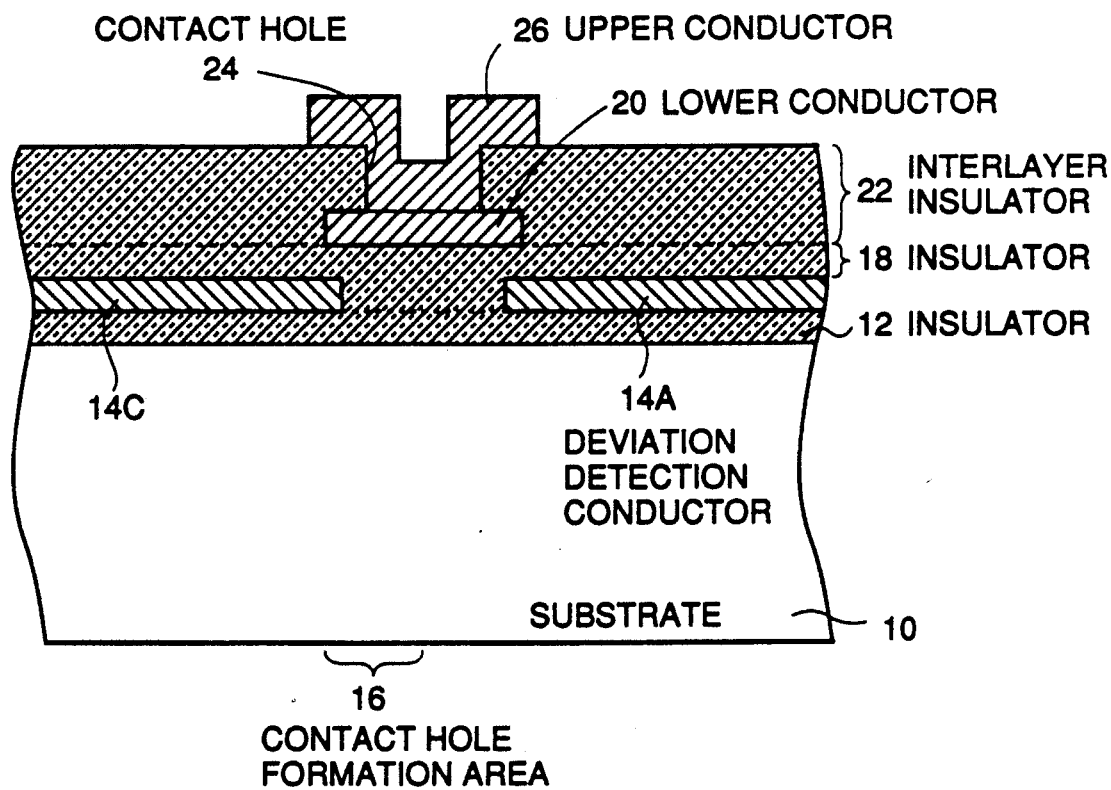
FIG. 1B is a diagrammatic sectional view taken along the line I—I in FIG. 1A.

Referring to FIGS. 1A and 1B, there are shown a diagrammatic plan view of a semiconductor device formed with one embodiment of a contact hole deviation checking conductor pattern in accordance with the present invention, in the case of no adverse deviation of the contact hole, and a diagrammatic sectional view taken along the line I—I in FIG. 1A.

The shown device includes a silicon substrate 10 and a first insulating layer 12 formed to cover an upper surface of the silicon substrate 10. On the first insulating layer 12, there is formed a contact hole deviation checking conductor pattern composed of four strip-shaped detection conductors 14A, 14B, 14C and 14D, each of which is formed to extend outwardly radially from a position slightly separated from a corresponding side of a rectangular contact hole formation area 16 in a plan view, as seen from FIG. 1A. The strip-shaped detection conductors 14A, 14B, 14C and 14D are located at equal angular intervals with regard to a center of the contact hole formation area 16, and extend in four directions orthogonal to one another in the shown embodiment. In addition, an edge of each of the detection conductors 14A, 14B, 14C and 14D near to the contact hole formation area 16 is separate from an outer edge of the contact hole formation area 16 by some distance which corresponds to, for example, a maximum admissible amount of a positional deviation of a contact hole.

Furthermore, a second insulating layer 18 is deposited to cover the detection conductors 14A, 14B, 14C and 14D and a portion of the first insulating layer 12 on which the detection conductors 14A, 14B, 14C and 14D are not formed. On the second insulating layer 18, a first or lower conducting layer 20 is formed and patterned in alignment with but larger in size than the contact hole formation area 16 in a plan view, as seen from FIG. 1A. In addition, a peripheral portion of the lower conducting layer 20 partially overlaps with each of the detection conductors 14A, 14B, 14C and 14D in a plan view, as also seen from FIGS. 1A and 1B.

A third insulating layer 22 is deposited to cover the lower conducting layer 20 and a portion of the second insulating layer 18 on which the lower conducting layer 20 is not formed. This third insulating layer 22 serves as an interlayer insulator.

Then, a contact hole 24 is formed in conformity with or in matching with the contact hole formation area 16 to pierce through the interlayer insulating layer 22. In ordinary cases, the size of the contact hole 24 is sufficiently smaller than that of the lower conducting layer 20. Therefore, if the formed contact hole 24 does not deviate from the contact hole formation area 16, namely, is in alignment with the contact hole formation area 16, an etching for formation of the contact hole 24 is blocked by the lower conducting layer 20. In other words, the contact hole 24 is positioned on only the lower conducting layer 20.

A second or upper conducting layer 26 is formed to fulfil in the contact hole 24 and patterned to form a desired wiring conductor.

Thus, as seen from FIGS. 1A and 1B, if the contact hole 24 is formed with no positional deviation, namely, if the formed contact hole 24 coincides with the contact hole formation area 16, only the lower and upper conducting layers 20 and 26 are interconnected by action of the contact hole 24.

Figure 2A:
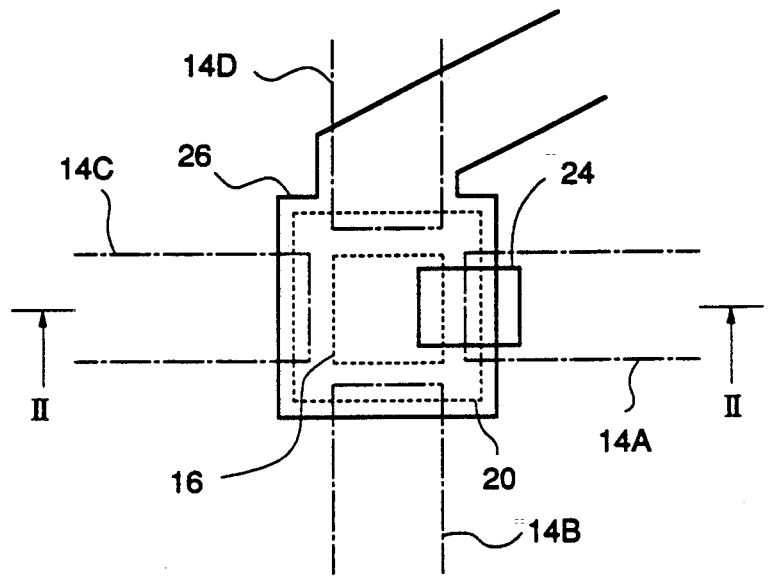
FIG. 2A is a diagrammatic plan view of a semiconductor device formed with one embodiment of a contact hole deviation checking conductor pattern in accordance with the present invention, in the case of an adverse deviation of the contact hole.
Figure 2B:
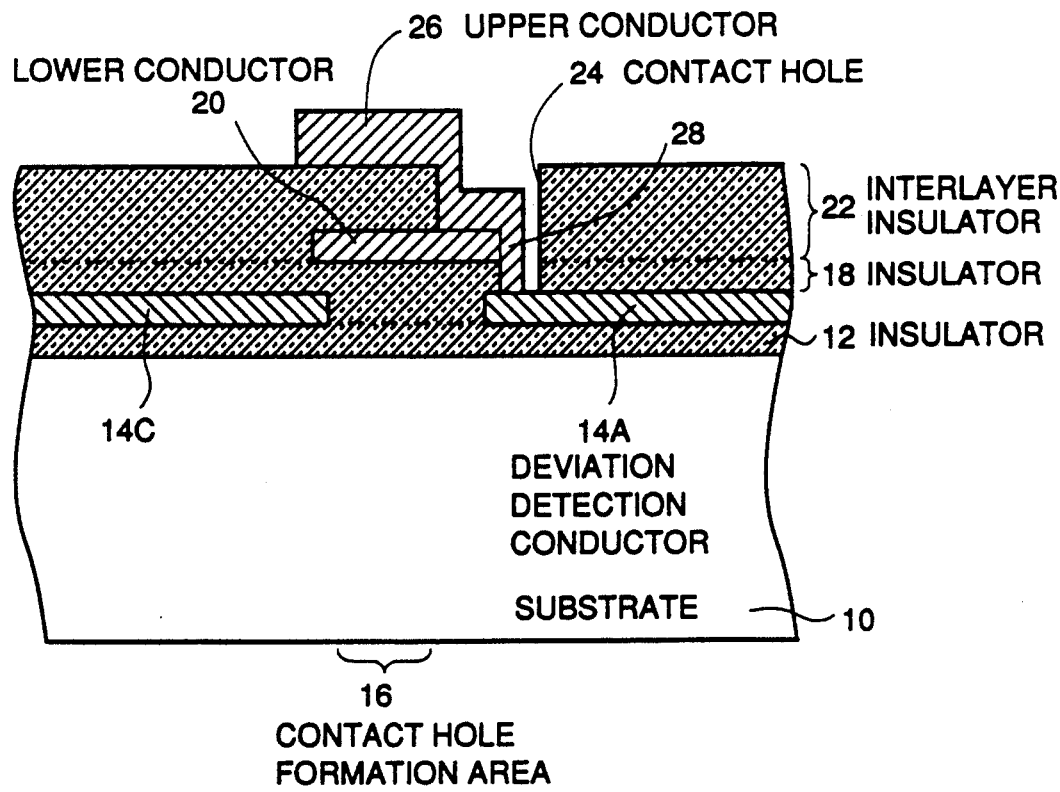
FIG. 2B is a diagrammatic sectional view taken along the line II—II in FIG. 2A.

However, if the formation position of the contact hole 24 substantially deviates as shown in FIGS. 2A and 2B, namely if the contact hole 24 is formed to partially protrude out of the lower conducting layer 20, the etching for formation of the contact hole is not completely blocked by the lower conducting layer 20, and the second insulating layer 18 between the detection conductor 14A and the lower conducting layer 20 are partially removed so that the contact hole 24 partially reaches to the detection conductor 14A. As a result, the upper conducting layer 26 having filled in the contact hole 24 has a portion 28 short-circuiting between the upper conducting layer 26 and the detection conductor 14A.

Therefore, by applying a voltage between the upper conducting layer 26 and the detection conductor 14A (for example, by applying a voltage between an electrode pad (not shown) connected to the upper conducting layer 26 and exposed at an outside of the semiconductor device and another electrode pad (not shown) connected to the detection conductor 14A and also exposed at an outside of the semiconductor device), the short-circuit between the upper conducting layer 26 and the detection conductor 14A can be known in an electric measurement manner. If a short-circuit can be detected between the upper conducting layer 26 and any one of the detection conductors 14A, 14B, 14C and 14D, it can be concluded that the formed contact hole 24 deviates from a proper formation position. To the contrary, if no short-circuit can be detected between the upper conducting layer 26 and any one of the detection conductors 14A, 14B, 14C and 14D, it can be concluded that the contact hole 24 is formed at a proper formation position with no positional deviation or with an admissible positional deviation.

In addition, if a contact hole larger than a desired size is formed at a proper formation position or with an admissible positional deviation, a short-circuit also occur between the upper conducting layer 26 and the detection conductors 14A, 14B, 14C and 14D. Therefore, whether or not the formed contact hole has a desired size, namely, a size of the formed contact hole can be known by detecting a short-circuit between the upper conducting layer 26 and all the detection conductors 14A, 14B, 14C and 14D.

In the above mentioned embodiment, the short-circuit has been detected between the upper conducting layer 26 and the detection conductors 14A, 14B, 14C and 14D. However, the short-circuit can been detected between the lower conducting layer 20 and the detection conductors 14A, 14B, 14C and 14D, as seen from FIG. 2B.

Furthermore, in the above mentioned example shown in FIGS. 2A and 2B, the upper conducting layer 26 and the detection conductor 14A are short-circuited. Since there are provided the four detection conductors 14A, 14B, 14C and 14D separate from one another and orthogonal to one another, a direction of the positional deviation of the contact hole can be determined by inspecting which of the four detection conductors 14A, 14B, 14C and 14D short-circuits with the upper conducting layer 26. In the above mentioned example shown in FIG. 2A, it can be judged on the basis of the short-circuit between the upper conducting layer 26 and the detection conductor 14A that the contact hole 24 has deviated in a right-hand direction of the proper formation position. However, if it is not necessary to know the direction of the positional deviation of the formed contact hole, the four detection conductors 14A, 14B, 14C and 14D can be replaced with a single detection conductor which extends to surround the contact hole formation area.

Figure 3:
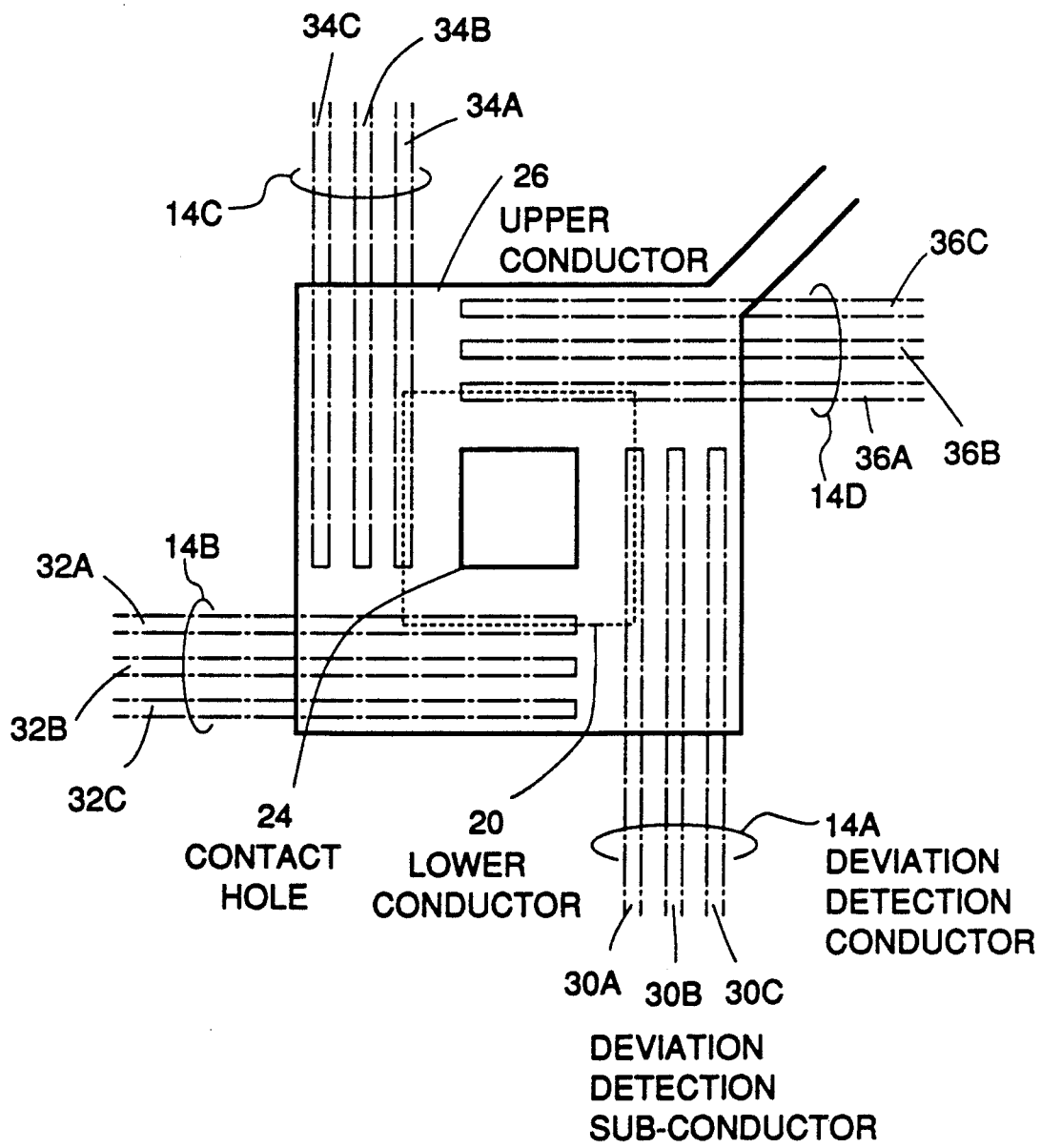
FIG. 3 is diagrammatic plan view of a semiconductor device formed with another embodiment of a contact hole deviation checking conductor pattern in accordance with the present invention, in the case of no adverse deviation of the contact hole.

Referring to FIG. 3, there is shown a diagrammatic plan view of a semiconductor device formed with another embodiment of a contact hole deviation checking conductor pattern in accordance with the present invention, in the case of no adverse deviation of the contact hole.

In the second embodiment, each detection conductor 14A, 14B, 14C or 14D formed in proximity with each side of the rectangular contact hole formation area 16 are divided into three separate sub-conductors 30A, 30B and 30C (32A, 32B and 32C, 34A, 34B and 34C, and 36A, 36B and 36C) which extend in parallel to the side concerned of the rectangular contact hole formation area 16, separately from the side concerned of the rectangular contact hole formation area 16 by different distances in a direction perpendicular to the side concerned of the rectangular contact hole formation area 16. The lower conducting layer 20 is formed to partially overlap with an innermost one of the three separate sub-conductors 30A, 32A, 34A, and 36A, and the upper conducting layer is formed to have a size sufficient to at least partially with an outermost one of the three separate sub-conductors 30C, 32C, 34C, and 36C.

In the second embodiment, not only the direction but also the amount of the positional deviation of the contact hole can be known by detecting which of the four detection conductors short-circuits with the upper or lower conducting layer 20 or 26 and by detecting which of the three sub-conductors (for example, 30A, 30B and 30C) short-circuits with the upper or lower conducting layer 20 or 26.

In the above mentioned embodiments, the detection conductors or subconductors can be formed of wiring conductors necessary to operation of the semiconductor device.

As seen from the above explanation, in accordance with the present invention, the detection conductor is formed at a position slightly separate from a contact hole formation area and at a level lower or deeper than a level at which a bottom of a contact hole is to be positioned. An electrical short-circuit between the detection conductor and the upper or lower conducting layer is detected for knowing a positional deviation of the formed contact hole. In other words, since the positional deviation of the formed contact hole can be detected in an electric manner, it is possible to greatly elevate the efficiency for checking the positional deviation of the formed contact hole.

The invention has thus been shown and described with reference to the specific embodiments. However, it should be noted that the present invention is in no way limited to the details of the illustrated structures but changes and modifications may be made within the scope of the appended claims.

I claim:

1. A method for detecting a positional deviation of a contact hole which is formed in a semiconductor integrated circuit formed on a semiconductor substrate, said contact hole being formed in an interlayer insulator layer to mutually connect a pair of conducting layers separated from each other by the interlayer insulator layer, comprising the following steps:

forming a detection conductor pattern on a substrate at a peripheral portion of a contact hole formation area in which the contact hole is to be formed, then forming a first insulating layer to cover said detection conductor pattern, further forming a first conducting layer of a predetermined pattern on said first insulating layer so as to cover said contact hole formation area, then forming a second insulating layer to cover said first conducting layer so as to form said interlayer insulator layer, thereafter forming said contact hole at the contact hole formation area in said second insulating layer, further forming a second conducting layer on said second insulation layer so that said second conducting layer is deposited within said contact hole to contact said first conducting layer in said contact hole, and detecting a short-circuit between said detection conductor pattern and one of said first and second conducting layers, whereby, when said short-circuit is detected, it is judged that the formed contact hole adversely deviates from a position of said first conducting layer because the contact hole formed with adverse deviation from said position of said first conducting layer perforates through said first insulating layer to reach said detection conductor pattern and therefore said second conducting layer deposited within said contact hole is in short-circuit with said detection conductor pattern.

2. A method claimed in claim 1 wherein said detection conductor pattern includes a plurality of conductors each extending outwardly apart from said contact hole formation area and separately from one another, and the step of detecting a short-circuit between said detection conductor pattern and one of said first and second conducting layer is performed by detecting a short-circuit between each of said plurality of conductors and one of said first and second conducting layers and determining a direction of the deviation of the formed contact hole on the basis of a conductor resulting in a short-circuit with said one of said first and second conducting layers.

3. A method claimed in claim 2 wherein said plurality of conductors extend outwardly apart from said contact hole formation area and are located at equal angular intervals.

4. A method claimed in claim 3 wherein said plurality of conductors include four conductors each extending radially outwardly apart from said contact hole formation area and located at equal intervals of a normal angle.

5. A method claimed in claim 2 wherein each of said plurality of conductors is divided into a plurality of sub-conductors located at different distances from said contact hole formation area and separately from one another, and the step of detecting a short-circuit between said detection conductor pattern and one of said first and second conducting layers is performed by detecting a short-circuit between each of said plurality of sub-conductors of each of said plurality of conductors and one of said first and second conducting layers and determining the amount and the direction of the deviation of the formed contact hole on the basis of a sub-conductor resulting in a short-circuit with said one of said first and second conducting layers.

6. A method for detecting a positional deviation of a contact hole which is formed in a semiconductor integrated circuit formed on a semiconductor substrate, said contact hole being formed in an interlayer insulator layer to mutually connect a pair of conducting layers separated from each other by the interlayer insulator layer, comprising the following steps:

forming a detection conductor pattern on a substrate at a peripheral portion of a contact hole formation area in which the contact hole is to be formed, wherein said detection conductor pattern is formed to at least partially surround said contact hole formation area, then forming a first insulating layer to cover said detection conductor pattern, further forming a first conducting layer of a predetermined pattern on said first insulating layer so as to cover said contact hole formation area, then forming a second insulating layer to cover said first conducting layer so as to form said interlayer insulator layer, thereafter forming said contact hole at the contact hole formation area in said second insulating layer, further forming a second conducting layer on said second insulation layer so that said second conducting layer is deposited within said contact hole to contact said first conducting layer in said contact hole, and detecting a short-circuit between said detection conductor pattern and one of said first and second conducting layers, whereby, when said short-circuit is detected, it is judged that the formed contact hole adversely deviates from a position of said first conducting layer because the contact hole formed with adverse deviation from said position of said first conducting layer perforates through said first insulating layer to reach said detection conductor pattern and therefore said second conducting layer deposited within said contact hole is in short-circuit with said detection conductor pattern.

7. A method claimed in claim 6 wherein said detection conductor pattern includes a plurality of conductors located at different distances from said contact hole formation area and separately from one another, and the step of detecting a short-circuit between said detection conductor pattern and one of said first and second conducting layers is performed by detecting a short-circuit between each of said plurality of conductors and one of said first and second conducting layers and determining the amount of the deviation of the formed contact hole on the basis of a conductor resulting in a short-circuit with said one of said first and second conducting layers.

8. A method for detecting a positional deviation of a contact hole which is formed in a semiconductor integrated circuit formed on a semiconductor substrate, said contact hole being formed in an interlayer insulator layer to mutually connect a pair of conducting layers separated from each other by the interlayer insulator layer, comprising the steps of:

forming a detection conductor pattern on a substrate at a peripheral portion of a contact hole formation area in which the contact hole is to be formed, forming a first insulating layer to cover said detection conductor pattern, forming a first conducting layer of a predetermined pattern on said first insulating layer in such a manner that said first conducting layer is substantially in alignment with but larger in size than said contact hole formation area and a peripheral portion of said conducting layer is at least partially overlapping with said detection conductor pattern in a plan view, forming a second insulating layer to cover said first conducting layer so as to form said interlayer insulator layer, forming in said second insulating layer said contact hole having a size smaller than that of said first conducting layer so that when said contact hole of a proper size is formed in alignment with said first conducting layer, said contact hole is completely blocked by said first conducting layer and said first conducting layer is exposed within said contact hole, forming a second conducting layer on said second insulation layer so that said second conducting layer is deposited within said contact hole to contact said first conducting layer within said contact hole and said second conducting layer has a size sufficient to at least partially overlap with said detection conductor pattern in a plan view, and detecting a short-circuit between said detection conductor pattern and one of said first and second conducting layers, whereby, when said short-circuit is detected, it is judged that the formed contact hole adversely deviates from a position of said first conducting layer because said contact hole formed with adverse deviation from said position of said first conducting layer perforates through said first insulating layer to reach said detection conductor pattern and therefore said second conducting layer deposited within said contact hole is in short-circuit with said detection conductor pattern.

* * * * *